(12) United States Patent
Mochizuki et al.

(10) Patent No.: US 11,921,167 B2
(45) Date of Patent: Mar. 5, 2024

(54) EARTH FAULT DETECTION APPARATUS

(71) Applicant: Yazaki Corporation, Tokyo (JP)

(72) Inventors: Yasuyuki Mochizuki, Makinohara (JP); Norio Sudo, Makinohara (JP); Ryosuke Arigaya, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/752,178

(22) Filed: May 24, 2022

(65) Prior Publication Data

US 2022/0381850 A1 Dec. 1, 2022

(30) Foreign Application Priority Data

May 31, 2021 (JP) ................................ 2021-091491

(51) Int. Cl.
  *G01R 31/52* (2020.01)
  *G01R 27/26* (2006.01)
  *G01R 31/12* (2020.01)

(52) U.S. Cl.
  CPC ......... *G01R 31/52* (2020.01); *G01R 27/2605* (2013.01); *G01R 31/12* (2013.01)

(58) Field of Classification Search
  CPC ...... G01R 27/00; G01R 27/02; G01R 27/025; G01R 27/26; G01R 27/2605; G01R 31/00; G01R 31/12; G01R 31/50; G01R 31/52
  USPC .................................................. 324/500, 509
  See application file for complete search history.

(56) References Cited

U.S. PATENT DOCUMENTS

| | | | |
|---|---|---|---|
| 11,047,923 B2 * | 6/2021 | Kawamura | G01R 31/52 |
| 11,493,564 B2 * | 11/2022 | Takamatsu | G01R 31/12 |
| 2017/0108556 A1 | 4/2017 | Yamamoto et al. | |
| 2021/0129675 A1 * | 5/2021 | Isaksson | B60R 16/03 |
| 2021/0148993 A1 * | 5/2021 | Takamatsu | G01R 31/52 |
| 2022/0381812 A1 * | 12/2022 | Mochizuki | G01R 31/52 |
| 2022/0381850 A1 * | 12/2022 | Mochizuki | G01R 27/2605 |
| 2023/0048778 A1 * | 2/2023 | Mochizuki | G01R 31/007 |

FOREIGN PATENT DOCUMENTS

| | | |
|---|---|---|
| JP | 2014-126382 A | 7/2014 |
| JP | 2016-6407 A | 1/2016 |
| JP | 2021-47107 A | 3/2021 |

* cited by examiner

*Primary Examiner* — Hoai-An D. Nguyen
(74) *Attorney, Agent, or Firm* — Sughrue Mion, PLLC

(57) ABSTRACT

An earth fault detection apparatus includes a switch group configured to switch between a first measurement path including a battery and a capacitor, a second measurement path including the battery, a negative-side insulation resistance, and the capacitor, a third measurement path including the battery, a positive-side insulation resistance, and the capacitor; and a control unit configured to calculate a reference value, based on each charging voltage of the capacitor in each measurement path, and configured to calculate an insulation resistance with reference to a predetermined conversion map, in which the conversion map includes a conversion map corresponding to a capacitance of the capacitor, and the control unit estimates the capacitance of the capacitor, and refers to the conversion map corresponding to the capacitance of the capacitor that has been estimated.

11 Claims, 4 Drawing Sheets

EARTH FAULT DETECTION APPARATUS

BACKGROUND

Technical Field

The present invention relates to an earth fault detection apparatus using a flying capacitor.

Related Art

In a vehicle such as a hybrid vehicle including an engine and an electric motor as driving sources or an electric vehicle, a battery equipped in a vehicle body is charged to generate a propulsive force with use of electric energy supplied from the battery. A battery-related power supply circuit is typically configured as a high-voltage circuit that handles a high voltage equal to or higher than 200 V. In order to ensure its safety, the high-voltage circuit including a battery has a non-grounded configuration electrically insulated from the vehicle body, which serves as a reference potential point of grounding.

In a vehicle equipped with a non-grounded high-voltage battery, an earth fault detection apparatus is provided to monitor an insulation state (earth fault) between the vehicle body and a system provided with the high-voltage battery, specifically, a main power supply system from the high-voltage battery to a motor. As the earth fault detection apparatus, a method of using a capacitor called a flying capacitor is widely used.

In order to obtain knowledge about an insulation resistance, the earth fault detection apparatus of a flying capacitor type selectively switches measurement paths via switches, each of the measurement paths including a detection capacitor functioning as the flying capacitor, wherein the earth fault detection apparatus performs a V0 measurement, a Vc1$n$ measurement, and a Vc1$p$ measurement. Here, the V0 measurement is a measurement of a voltage corresponding to the voltage of the high-voltage battery. The Vc1$n$ measurement is a measurement of a voltage reflecting influence of RLn, which is an insulation resistance on the negative side. The Vc1$p$ measurement is a measurement of a voltage reflecting influence of RLp, which is an insulation resistance on the positive side.

It is known that the insulation resistance obtained by combining the insulation resistance on the positive side and the insulation resistance on the negative side together can be calculated from V0, Vc1$n$, and Vc1$p$ that have been obtained through these measurements. The operation for the calculation is complicated. Hence, a conversion map for converting the insulation resistance with Vc1/V0 (where Vc1=Vc1$p$+Vc1$n$) as a reference value is generally prepared in advance. The insulation resistance is then estimated from the value of Vc1/V0 that has been obtained through the measurements with reference to the conversion map, and an occurrence of an earth fault is determined.

In any of the measurements of V0, Vc1$n$, and Vc1$p$, a charging voltage, at the time when the detection capacitor has been charged for a predetermined charging time Δtm, is measured and set as a measurement value. The charging time Δtm is set to such a value that the detection capacitor is not fully charged in order to determine the earth fault in a short time. On the other hand, in a case where the charging time Δtm is too short, the charging voltage decreases, and the detection accuracy decreases because of influences of noise and the like. For this reason, the charging time Δtm is determined in consideration of the balance between the determination time and the detection accuracy.

Patent Literature 1: JP 2017-78587 A

SUMMARY

It is possible to calculate the conversion map for obtaining the insulation resistance from the reference value that has been obtained from the respective measurement results of the V0 measurement, the Vc1$n$ measurement, and the Vc1$p$ measurement, based on the capacitance of the detection capacitor, the value of the charging resistor provided on the measurement path, and the charging time Δtm.

The values of the charging resistor and the charging time Δtm can be set to stable values with few variation. However, the capacitances of the individual detection capacitors differ from each other relatively largely, and in addition, changes under an influence of a surrounding environment such as temperature.

In a case where the capacitance of the detection capacitor when measured changes from the capacitance of the detection capacitor set when the conversion map is created, the accuracy of the insulation resistance to be calculated may be degraded.

Therefore, the present invention has an object to prevent a decrease in calculation accuracy of an insulation resistance, even when the capacitance of a detection capacitor changes, in an earth fault detection apparatus of a flying capacitor type.

In order to address the above issue, an earth fault detection apparatus in the present invention is an earth fault detection apparatus to be connected with a non-grounded battery and for calculating an insulation resistance of a system including the battery, the earth fault detection apparatus including:

a capacitor configured to operate as a flying capacitor;

a switch group configured to switch between a first measurement path, a second measurement path, and a third measurement path, the first measurement path including the battery and the capacitor, the second measurement path including the battery, a negative-side insulation resistance that is an insulation resistance between a negative-side line of the battery and ground, and the capacitor, the third measurement path including the battery, a positive-side insulation resistance that is an insulation resistance between a positive-side line of the battery and the ground, and the capacitor; and a control unit configured to calculate a reference value based on each charging voltage of the capacitor in each of the first to third measurement paths, and configured to calculate the insulation resistance with reference to a predetermined conversion map, in which the conversion map includes a conversion map corresponding to a capacitance of the capacitor, and the control unit estimates the capacitance of the capacitor, and refers to the conversion map corresponding to the capacitance of the capacitor that has been estimated.

According to the present invention, in the earth fault detection apparatus of the flying capacitor type, even when the capacitance of the detection capacitor changes, a decrease in the calculation accuracy of the insulation resistance can be prevented.

DETAILED DESCRIPTION

Figure 1:
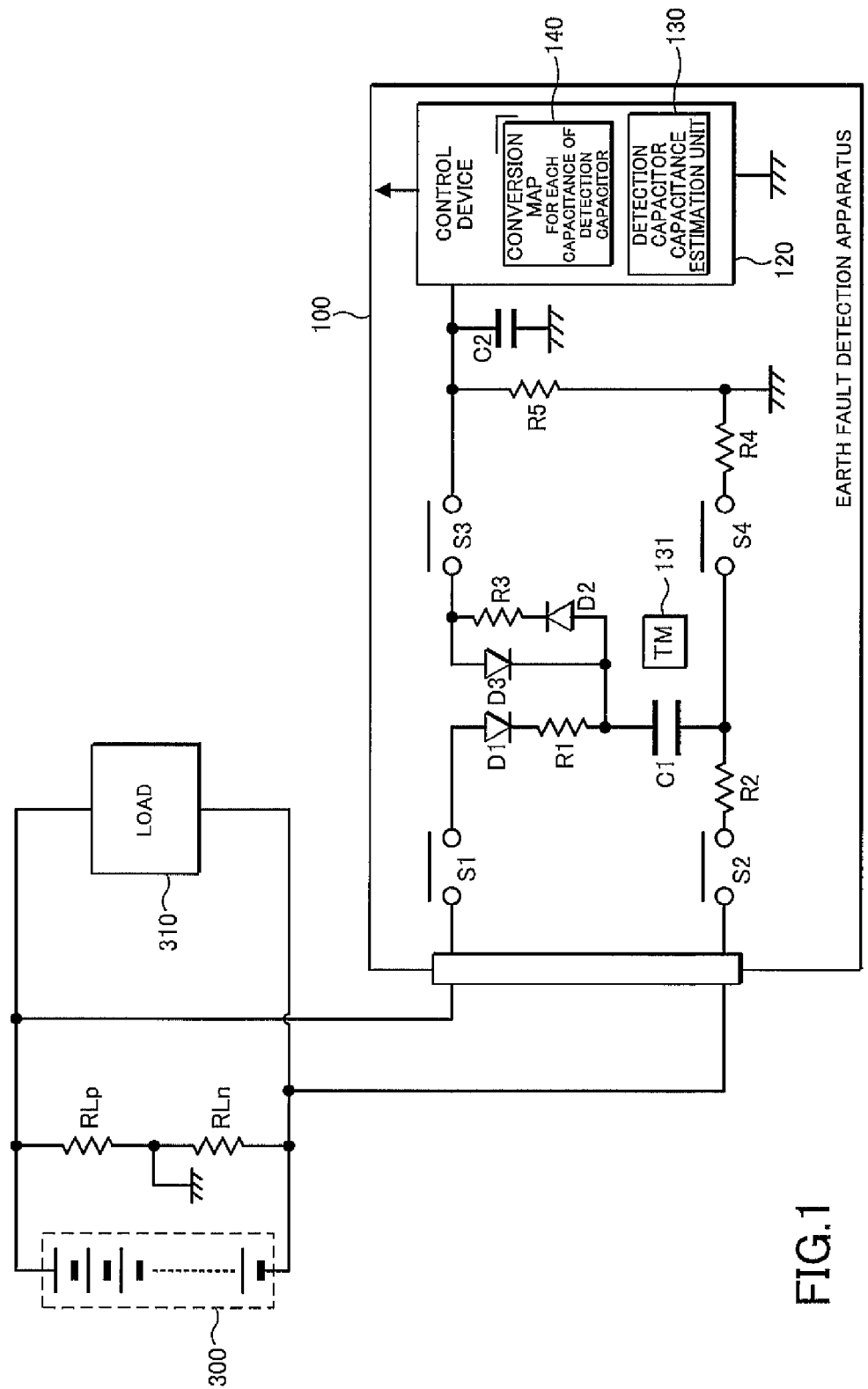
FIG. 1 is a block diagram illustrating a configuration of an earth fault detection apparatus according to an embodiment of the present invention.

Embodiments of the present invention will be described in detail with reference to the drawings. FIG. 1 is a block diagram illustrating a configuration of an earth fault detection apparatus 100 according to an embodiment of the present invention. As illustrated in the drawing, the earth fault detection apparatus 100 is an apparatus of a flying capacitor type that is connected with a high-voltage battery 300 and that detects an earth fault of a system provided with the high-voltage battery 300. Here, RLp represents an insulation resistance between the positive side of the high-voltage battery 300 and the ground, and RLn represents an insulation resistance between the negative side thereof and the ground.

The high-voltage battery 300 is a battery used for driving a vehicle to travel. The high-voltage battery 300 is configured with a rechargeable battery such as a lithium ion battery, and drives a load 310 including e.g. an electric motor.

As illustrated in the drawing, the earth fault detection apparatus 100 includes a detection capacitor C1 that operates as a flying capacitor, and a control device 120.

In addition, the earth fault detection apparatus 100 includes four switches S1 to S4 in the surroundings of the detection capacitor C1 in order to switch the measurement paths and to control charging and discharging of the detection capacitor C1. These switches each can be configured with an insulating switching element, such as an optical MOSFET.

The switch S1 has a first end connected with a positive-side power supply line and a second end connected with an anode side of a diode D1. A cathode side of the diode D1 is connected with a first end of a resistor R1, and a second end of the resistor R1 is connected with a first pole of the detection capacitor C1. The switch S2 has a first end connected with a negative-side power supply line and a second end connected with a first end of a resistor R2. A second end of the resistor R2 is connected with a second pole of the detection capacitor C1.

The switch S3 has a first end connected with a first end of a resistor R3 and an anode side of a diode D3, and a second end connected with a first end of a resistor R5, an analog input terminal of the control device 120, and a first pole of a capacitor C2 having a second pole that is grounded. A cathode side of the diode D3 is connected with the first pole of the detection capacitor C1, a second end of the resistor R3 is connected with a cathode side of a diode D2, and an anode side of the diode D2 is connected with the first pole of the detection capacitor C1. A second end of a resistor R5 is grounded. The switch S4 has a first end connected with the second pole of the detection capacitor C1 and a second end connected with a first end of a resistor R4. A second end of the resistor R4 is grounded.

The control device 120 is configured with a microcomputer or the like, and executes a program that has been incorporated beforehand to conduct various types of control required for the earth fault detection apparatus 100. Specifically, the control device 120 controls the switches S1 to S4 to switch the measurement paths individually, and also controls charging and discharging of the detection capacitor C1.

The respective measurement circuits for the V0 measurement, the Vc1$n$ measurement, and the Vc1$p$ measurement are similar to those in the related art. That is, in the V0 measurement, the switches S1 and S2 are turned on to charge the detection capacitor C1. In the Vc1$n$ measurement, the switches S1 and S4 are turned on to charge the detection capacitor C1. In the Vc1$p$ measurement, the switches S2 and S3 are turned on to charge the detection capacitor C1.

In addition, the control device 120 receives an input of an analog level corresponding to the charging voltage of the detection capacitor C1 from an analog input terminal, wherein the analog level serves as a measurement value. A decrease in the insulation resistance of the system provided with the high-voltage battery 300 is detected based on such a measurement value. When the charging voltage for the detection capacitor C1 is applied to the analog input terminal, the switches S3 and S4 are turned on. In this path, the detection capacitor C1 is also discharged.

The above description relates to a basic circuit configuration widely used in the earth fault detection apparatus of a flying capacitor type. However, the earth fault detection apparatus of the flying capacitor type has various modifications. The configuration of the earth fault detection apparatus 100 is not limited to the example in the drawing.

In the present embodiment, the control device 120 further includes a detection capacitor capacitance estimation unit 130 and a conversion map 140. For example, the detection capacitor capacitance estimation unit 130 can be configured by the control device 120 executing a predetermined program, and the conversion map 140 can be configured in a storage area included in the control device 120.

The detection capacitor capacitance estimation unit 130 is a block that estimates a current capacitance of the detection capacitor C1. A method for estimating the current capacitance of the detection capacitor C1 is not limited, and various methods are adoptable.

For example, the capacitance of the capacitor is generally influenced by temperature. Hence, it is possible to measure the temperature around the detection capacitor C1 using a thermometer TM131 (see FIG. 1), and to calculate a change from the initial capacitance for estimation. In addition, the capacitance of the detection capacitor C1 may be estimated through actual measurements. For example, the detection capacitor C1 that has been charged is discharged for a predetermined time, and the capacitance can be calculated based on a change in the charging voltage before and after the discharge. In this case, the thermometer TM131 may be omitted. A procedure for estimating the current capacitance of the detection capacitor C1 will be described later.

The conversion map 140 is a map for converting a reference value obtained from the V0 measurement, the Vc1$n$ measurement, and the Vc1$p$ measurement into a value of the insulation resistance. The conversion map 140 is created to correspond to the capacitance of the detection capacitor. For example, the capacitance can be classified into a plurality of groups in accordance with its magnitude, and the conversion map 140 can be created for each group. For each group, a capacitance representing the group is determined. For example, it is possible to set the capacitance representing the median value of the group defined by an upper limit capacitance and a lower limit capacitance.

The conversion map 140 can be calculated, based on the capacitance of the detection capacitor C1, the values of the charging resistors (R1, R2) provided in the measurement path, and the charging time Δtm. Here, the values of the charging resistors and the charging time Δtm are fixed, and the capacitance of the detection capacitor C1 is changed by the capacitance representing the group to create the conversion map 140 for each group. The conversion map 140 includes a standard conversion map 140 that has been created to correspond to the initial capacitance of the detection capacitor C1.

After calculating the reference value based on the V0 measurement, the Vc1n measurement, and the Vc1p measurement, the control device 120 calculates the insulation resistance with reference to the standard conversion map 140 or the conversion map 140 corresponding to the estimated value of the current capacitance of the detection capacitor C1.

The earth fault detection apparatus 100 in the present embodiment calculates the insulation resistance with reference to the conversion map 140 corresponding to the estimated value of the current capacitance of the detection capacitor C1. Therefore, even when the capacitance of the detection capacitor changes, a decrease in the calculation accuracy of the insulation resistance can be prevented.

Figure 2A:
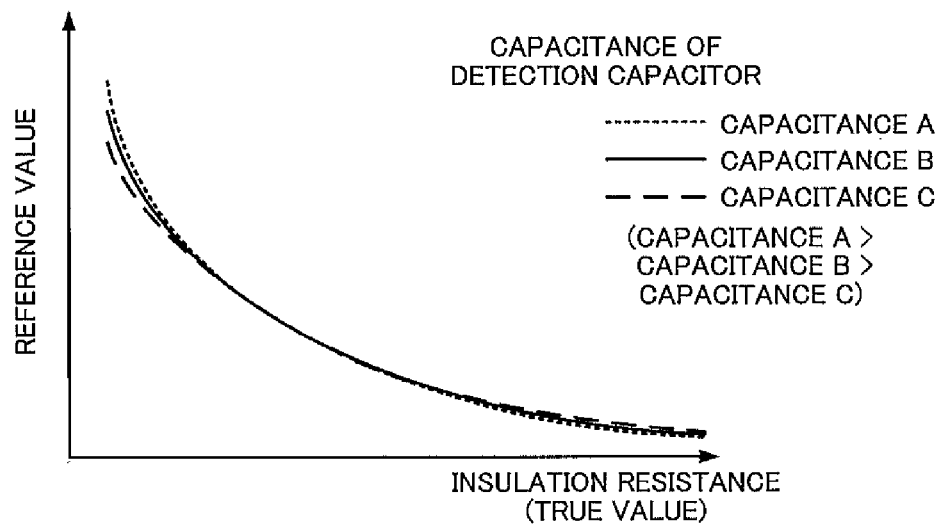
FIGS. 2A and 2B are diagrams for describing a variation and a detection error of a detection capacitor.

Here, a variation and a detection error of the detection capacitor C1 will be described with reference to FIGS. 2A and 2B. FIG. 2A illustrates changes in the reference value with respect to the insulation resistance of a case where the capacitance of the detection capacitor increases from an initial capacitance B to a capacitance A, and a case where the capacitance decreases to a capacitance C. As illustrated in the diagram, differences occur in the reference value for each capacitance between a region where the insulation resistance is low and a region where the insulation resistance is high, and such differences are remarkably large in the region where the insulation resistance is low.

Figure 2B:
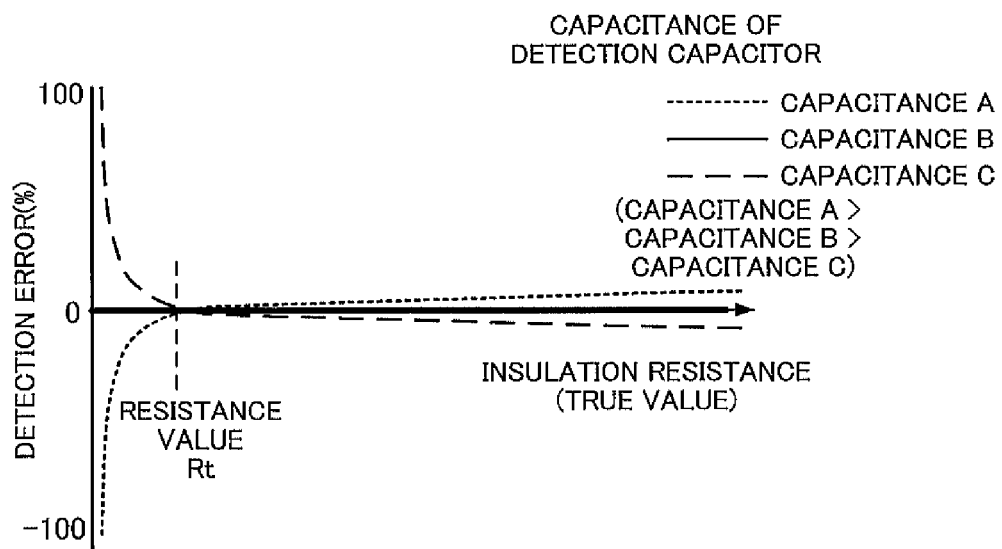

FIG. 2B illustrates a detection error in a case where the insulation resistance is calculated with a standard conversion map corresponding to the initial capacitance B, based on the reference value that has been obtained in each case of the capacitance A, the capacitance B, and the capacitance C. In the region where the insulation resistance is low, the differences in the reference value depending on the capacitance are obvious, and the ratio of the error to the true insulation resistance increases, and the detection error is extremely large. Theoretically, the error becomes zero at a resistance value Rt at which the insulation resistance is equal to the charging resistor. However, when the insulation resistance becomes lower than it, the error becomes abruptly worse, and the calculation accuracy decreases.

Conversely, unless the insulation resistance decreases as low as the charging resistor, the change in the capacitance of the detection capacitor C1 does not largely affect the calculation accuracy of the insulation resistance.

For this reason, in the present embodiment, in a case where there is a possibility that the insulation resistance is decreased, the current capacitance of the detection capacitor C1 is estimated, and the conversion map 140 corresponding to the current capacitance of the detection capacitor C1 that has been estimated is referred to. On the other hand, in a case where there is no possibility that the insulation resistance is decreased, the current capacitance of the detection capacitor C1 is not estimated, and the standard conversion map 140 is referred to.

Accordingly, it is sufficient to prepare the conversion map 140 corresponding only to the region where the insulation resistance is decreased except for the standard conversion map 140. Therefore, the storage area for the conversion map 140 in the control device 120 can be saved.

However, regardless of the possibility that the insulation resistance is decreasing, the current capacitance of the detection capacitor C1 may be estimated, and the conversion map 140 corresponding to the current capacitance of the detection capacitor C1 that has been estimated may be referred to. Accordingly, the calculation accuracy of the insulation resistance can be further improved.

Figure 3:
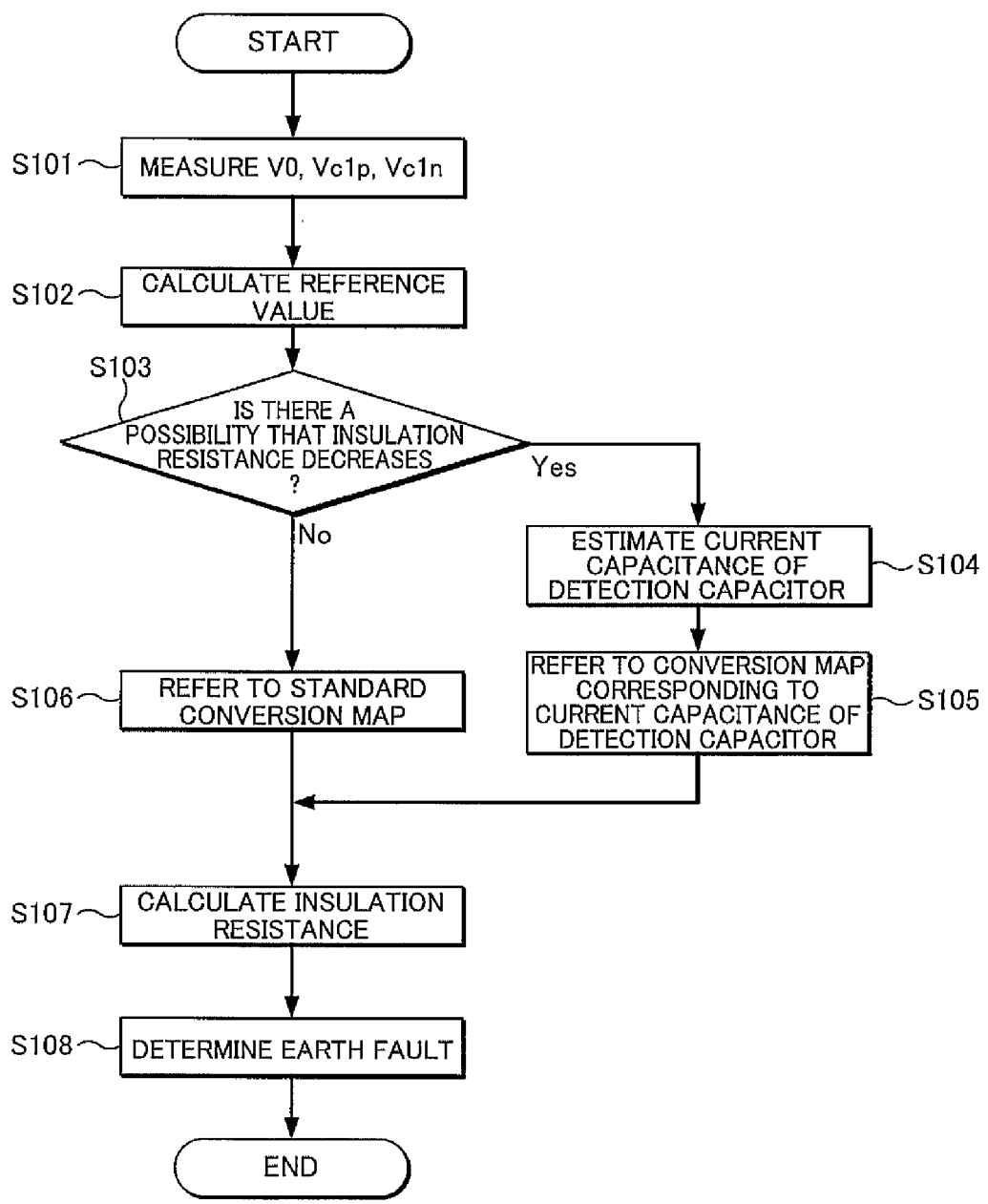
FIG. 3 is a flowchart for describing an earth fault determination operation of the earth fault detection apparatus.

Next, an earth fault determination operation by the earth fault detection apparatus 100 having the above configuration, will be described with reference to a flowchart of FIG. 3. This operation is performed under the control of the control device 120.

First, opening and closing of the switches S1 to S4 are controlled, and the V0, Vc1n, and Vc1p measurements are respectively performed (S101). Then, a reference value is calculated, based on V0, Vc1n, and Vc1p that have been obtained through the measurements (S102).

Whether there is a possibility that the insulation resistance is decreasing is determined, based on V0, Vc1n, and Vc1p that have been obtained through the measurements (S103). As described above, an error increases when the insulation resistance is lower than the charging resistor. Therefore, for example, a case where V0<(Vc1n+Vc1p) is established can be considered as an indication that the insulation resistance is decreased.

As a result, in a case where it is determined that there is the possibility that the insulation resistance is decreasing (S103: Yes), the detection capacitor capacitance estimation unit 130 estimates the current capacitance of the detection capacitor C1 (S104). The procedure for estimating the current capacitance of the detection capacitor C1 will be described later.

Then, with reference to the conversion map 140 corresponding to the capacitance of the detection capacitor C1 that has been estimated (S105), the insulation resistance is calculated (S107). After the insulation resistance is calculated, an earth fault is determined, based on whether the insulation resistance that has been obtained is lower than a predetermined reference value (S108).

On the other hand, in a case where it is determined that there is no possibility that the insulation resistance is decreasing (S103: No), with reference to the standard conversion map 140 (S106), the insulation resistance is calculated (S107). After the insulation resistance is calculated, an earth fault is determined, based on whether the insulation resistance that has been obtained is lower than a predetermined reference value (S108).

Figure 4:
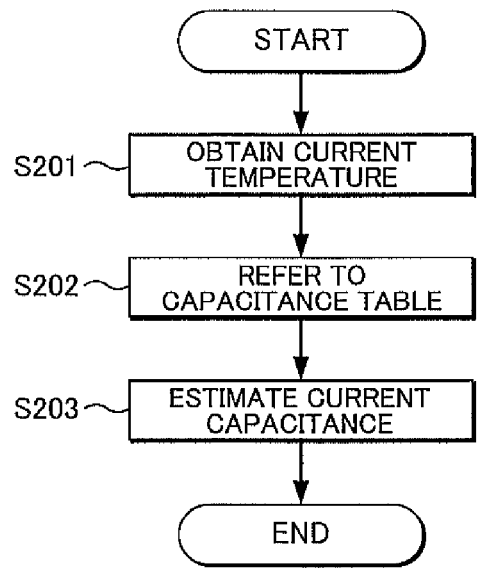
FIG. 4 is a flowchart for describing a method for estimating a capacitance of the detection capacitor based on an ambient temperature.

Finally, a description will be given with regard to an example of estimating, by the detection capacitor capacitance estimation unit 130, the current capacitance of the detection capacitor C1. First, a procedure for an estimation method based on an ambient temperature of the detection capacitor C1 will be described with reference to a flowchart of FIG. 4.

In the present method, the actual capacitance of the detection capacitor C1 at a reference temperature is measured before shipment of the earth fault detection apparatus 100. The actual capacitance of the detection capacitor C1 can be calculated by, for example, discharging the charged detection capacitor C1 for a predetermined time and measuring a change in charging voltage before and after the discharge.

Then, the estimated capacitance of the detection capacitor C1 for each ambient temperature is actually measured or theoretically obtained together with the actual capacitance, and is written as a capacitance table in a storage area in the control device 120 that can be referred to by the detection capacitor capacitance estimation unit 130. Instead of the capacitance table, a calculation formula or the like for calculating the present capacitance of the detection capacitor C1 from the ambient temperature may be written.

When the present capacitance of the detection capacitor C1 is estimated, the ambient temperature of the detection capacitor C1 is acquired with use of the thermometer TM131 (S201). Then, the capacitance table that has been written before the shipment is referred to (S202), and the capacitance corresponding to the ambient temperature is estimated as the present capacitance of the detection capacitor C1 (S203).

Figure 5:
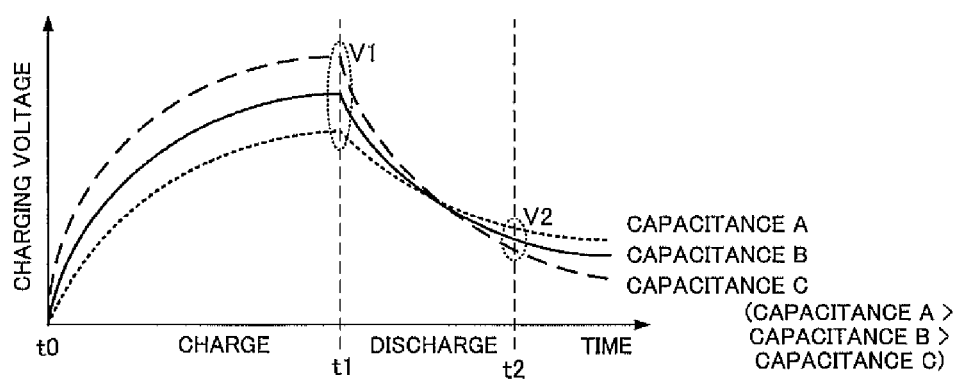
FIG. 5 is a diagram for describing a method for estimating a capacitance of the detection capacitor through actual measurements.

Next, a method for estimating the present capacitance of the detection capacitor C1 through actual measurements will be described with reference to FIG. 5. Here, the detection capacitor C1 that has been charged is discharged for a predetermined time, and the present capacitance of the detection capacitor C1 is calculated, based on a change in the charging voltage before and after discharge. This technique is described in JP 2017-78587 A, only its outline will be described.

As illustrated in the drawing, in a case where the detection capacitor C1 is charged between a time t0 and a time t1 and discharged between a time t1 and a time t2, the ratio of a charging voltage V2 at the time t2 to a charging voltage V1 at the time t1 depends on the capacitance of the detection capacitor C1. Note that it is assumed that the charging resistor is known and constant.

For this reason, the detection capacitor capacitance estimation unit 130 controls openings and closings of the switches S1 to S4, charges and discharges the detection capacitor C1 for a predetermined time, and measures the charging voltage V1 of the detection capacitor at the time of ending the charging and the charging voltage V2 of the detection capacitor at the time of ending the discharging. Then, the current capacitance of the detection capacitor C1 is calculated, based on the charging voltages that have been measured and the resistance related to the discharging time.

Specifically, $C1=(t2-t1)/(Rd \times \ln(V2/V1))$ can be used for calculation, where Rd represents the resistance related to the discharging time.

As described heretofore, the earth fault detection apparatus 100 in the present embodiment estimates the current capacitance of the detection capacitor C1, and calculates the insulation resistance with reference to the conversion map 140 corresponding to the estimated value. Therefore, even when the capacitance of the detection capacitor changes, a decrease in the calculation accuracy of the insulation resistance can be prevented.

In this situation, in a case where there is no possibility that the insulation resistance is decreasing, the standard conversion map 140 may be referred to without an estimation of the current capacitance of the detection capacitor C1. Accordingly, the storage area for the conversion map 140 in the control device 120 can be saved.

REFERENCE SIGNS LIST

100 Earth fault detection apparatus
120 Control device
130 Detection capacitor capacitance estimation unit
140 Conversion map
300 High-voltage battery
310 Load

What is claimed is:

1. An earth fault detection apparatus to be connected with a non-grounded battery and for calculating an insulation resistance of a system including the battery, the earth fault detection apparatus comprising:
   a capacitor configured to be operated as a flying capacitor;
   a switch group configured to switch between a first measurement path, a second measurement path, and a third measurement path, the first measurement path including the battery and the capacitor, the second measurement path including the battery, a negative-side insulation resistance that is an insulation resistance between a negative-side line of the battery and ground, and the capacitor, the third measurement path including the battery, a positive-side insulation resistance that is an insulation resistance between a positive-side line of the battery and the ground, and the capacitor; and
   a control unit configured to calculate a reference value based on each charging voltage of the capacitor in each of the first to third measurement paths, and configured to calculate the insulation resistance with reference to a conversion map, wherein
   the conversion map includes conversion maps corresponding to capacitances of the capacitor and including a standard conversion map,
   upon determining, based on the reference value, that the insulation resistance is lower than a predetermined standard, the control unit is configured to estimate the capacitance of the capacitor, and to calculate the insulation resistance by referring to the conversion map corresponding to the capacitance of the capacitor that has been estimated, and
   upon determining, based on the reference value, that the insulation resistance is not lower than the predetermined standard, the control unit is configured to calculate the insulation resistance by referring to the standard conversion map.

2. The earth fault detection apparatus according to claim 1,
   wherein the control unit is configured to measure a charging voltage before and after discharging the capacitor for a predetermined time, wherein the discharging is performed after charging the capacitor, and
   wherein the control unit is configured to estimate the capacitance of the capacitor based on a measurement value of the charging voltage before and after discharging.

3. The earth fault detection apparatus according to claim 1, wherein the conversion map corresponding to the capacitance of the capacitor is created within a range of the reference value in which the insulation resistance is determined to be lower than the predetermined standard.

4. The earth fault detection apparatus according to claim 1, wherein the control unit is configured to obtain an ambient temperature of the capacitor, and estimate the capacitance of the capacitor, based on the ambient temperature that has been obtained.

5. The earth fault detection apparatus according to claim 3, wherein the control unit is configured to obtain an ambient temperature of the capacitor, and estimate the capacitance of the capacitor, based on the ambient temperature that has been obtained.

6. The earth fault detection apparatus according to claim 3,
   wherein the control unit is configured to measure a charging voltage before and after discharging the capacitor for a predetermined time, wherein the discharging is performed after charging the capacitor, and wherein the control unit is configured to estimate the capacitance of the capacitor based on a measurement value of the charging voltage before and after discharging.

7. An earth fault detection apparatus to be connected with a non-grounded battery and for calculating an insulation resistance of a system including the battery, the earth fault detection apparatus comprising:

a capacitor configured to be operated as a flying capacitor;

a switch group configured to switch between a first measurement path, a second measurement path, and a third measurement path, the first measurement path including the battery and the capacitor, the second measurement path including the battery, a negative-side insulation resistance that is an insulation resistance between a negative-side line of the battery and ground, and the capacitor, the third measurement path including the battery, a positive-side insulation resistance that is an insulation resistance between a positive-side line of the battery and the ground, and the capacitor; and a control unit configured to calculate a reference value based on each charging voltage of the capacitor in each of the first to third measurement paths, and configured to calculate the insulation resistance with reference to a predetermined conversion map, wherein the conversion map includes conversion maps corresponding to capacitances of the capacitor and including a standard conversion map, the control unit is configured to use charging voltages of the capacitor in the first, second and third measurement paths in order to perform determination whether or not there is a possibility that the insulation resistance is decreased, upon determining that there is a possibility that the insulation resistance is decreased, the control unit is configured to estimate the capacitance of the capacitor, and to calculate the insulation resistance by referring to the conversion map corresponding to the capacitance of the capacitor that has been estimated, and upon determining that there is no possibility that the insulation resistance is decreased, the control unit is configured to calculate the insulation resistance by referring to the standard conversion map.

8. The earth fault detection apparatus according to claim 7, wherein the determination whether or not there is a possibility that the insulation resistance is decreased is performed based on determination whether $$V0 < (Vc1n + Vc1p)$$

is established or not, wherein

V0 is the charging voltage in the first measurement path,

Vc1n is the charging voltage in the second measurement path, and

Vc1p is the charging voltage in the third measurement path.

9. The earth fault detection apparatus according to claim 7, wherein the conversion map corresponding to the capacitance of the capacitor is created within a range of the reference value in which the insulation resistance is determined to be lower than the predetermined standard.

10. The earth fault detection apparatus according to claim 7, wherein the control unit is configured to obtain an ambient temperature of the capacitor, and estimate the capacitance of the capacitor, based on the ambient temperature that has been obtained.

11. The earth fault detection apparatus according to claim 7, wherein the control unit is configured to measure a charging voltage before and after discharging the capacitor for a predetermined time, wherein the discharging is performed after charging the capacitor, and wherein the control unit is configured to estimate the capacitance of the capacitor based on a measurement value of the charging voltage before and after discharging.

* * * * *